US006476331B1

United States Patent
Kim et al.

(12) 
(10) Patent No.: US 6,476,331 B1
(45) Date of Patent: Nov. 5, 2002

(54) PRINTED CIRCUIT BOARD FOR SEMICONDUCTOR PACKAGE AND METHOD FOR MANUFACTURING THE SAME

(75) Inventors: Sung Jin Kim, Seoul (KR); Sun Jin Son, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/783,797

(22) Filed: Feb. 14, 2001

(30) Foreign Application Priority Data

Jun. 19, 2000 (KR) ......................................... 2000-33632
Dec. 5, 2000 (KR) ......................................... 2000-73375

(51) Int. Cl.⁷ ................................................. H01R 9/09
(52) U.S. Cl. ........................ 174/261; 174/255; 361/772
(58) Field of Search ................................. 174/261, 260, 174/250, 258; 430/311; 361/761, 748, 772; 427/96

(56) References Cited

U.S. PATENT DOCUMENTS

| 5,355,283 | A | | 10/1994 | Marrs et al. ................. 361/760 |
| 5,386,342 | A | | 1/1995 | Rostoker ..................... 361/749 |
| 5,397,917 | A | | 3/1995 | Ommen et al. ............. 257/698 |
| 5,436,411 | A | * | 7/1995 | Pasch .......................... 174/261 |
| 5,450,283 | A | | 9/1995 | Lin et al. ..................... 361/704 |
| 5,640,047 | A | | 6/1997 | Nakashima .................. 257/738 |
| 5,650,593 | A | | 7/1997 | McMillan et al. .......... 174/52.4 |
| 5,665,525 | A | * | 9/1997 | Pienimaa ..................... 430/311 |
| 5,763,060 | A | * | 6/1998 | Kerrick ....................... 174/261 |
| 5,929,522 | A | | 7/1999 | Weber ......................... 257/738 |
| 5,962,917 | A | | 10/1999 | Moriyama .................... 257/697 |
| 6,034,427 | A | | 3/2000 | Lan et al. .................... 257/698 |
| 6,246,015 | B1 | * | 6/2001 | Kim ............................ 174/261 |
| 6,249,053 | B1 | | 6/2001 | Nakata et al. .............. 257/738 |

* cited by examiner

Primary Examiner—Albert W. Paladini
(74) Attorney, Agent, or Firm—Skjerven Morrill LLP; James E. Parsons

(57) ABSTRACT

A printed circuit board for a semiconductor package, a semiconductor package, and methods for manufacturing the same are disclosed. One printed circuit board includes a core layer with circuit patterns formed thereon. The circuit patterns do not extend to a periphery of the circuit board. Each circuit pattern includes a bond finger and/or an input/output land. A solder mask is provided over the circuit patterns, except for bond fingers and lands. A first metal layer is plated only on the horizontal outer surface of the bond finger and/or ball land of the respective circuit pattern, and not over the remainder of the circuit pattern. The localized plating of the first metal layer enhances adhesion of the solder mask to the circuit patterns, enhances adhesion of an encapsulant to the bond fingers, and avoids waste of the first metal layer material.

24 Claims, 10 Drawing Sheets ns. A method for manufacturing a printed circuit board in accordance with the present invention

PRINTED CIRCUIT BOARD FOR SEMICONDUCTOR PACKAGE AND METHOD FOR MANUFACTURING THE SAME

BACKGROUND OF THE INVENTION

1. Field of the Invention

The present invention includes a printed circuit board for a semiconductor package and related methods and structures.

2. Description of the Related Art

In the market for semiconductor packages, there is a trend toward ever smaller, more efficient, higher capacity, and less expensive packages with excellent heat transfer capabilities and electrical properties. Consistent with such trends, semiconductor packages today are often made to have an internal printed circuit board substrate, rather than a metal leadframe substrate.

A conventional single-layered printed circuit board 100' is shown in FIGS. 7a and 7b. Thin copper circuit patterns 4 are formed on opposing upper and lower surfaces 2a, 2b of a resin layer 2. A chip mounting section 12 is formed on a center portion of upper surface 2a of resin layer 2. The circuit patterns 4 on the upper and lower surfaces 2a, 2b of the resin layer 2 are electrically connected with each other by conductive via-holes 10 through resin layer 2. The circuit patterns 4 on upper surface 2a of resin layer 2 include bond fingers 4a, which are ultimately electrically connected to a semiconductor chip (not shown) provided on chip mounting section 12. The circuit patterns 4 on lower surface 2b of resin layer 2 include ball lands 4b to which conductive balls are ultimately fused. The entire areas of the upper and lower surfaces 2a and 2b and circuit patterns 4, excluding bond fingers 4a and ball lands 4b, are coated with a protective solder mask 8. Plating layer 6 is formed on the bond fingers 4a and ball lands 4b of the circuit patterns 4 by an electroplating technique using nickel (Ni) and gold (Au) so as to facilitate the subsequent bonding of conductive wires and conductive balls thereto, respectively. Singulation holes 14 provide a reference for a singulation process that severs the circuit board strip. Index holes 16 provide a reference for loading the printed circuit board 100' on automated manufacturing equipment.

A method for manufacturing printed circuit board 100' includes providing a resin layer 2 that has a copper film layer laminated on its upper and lower surfaces. Subsequently, holes are formed through resin layer 2 and the copper film layers. A metal coating is provided on the circumferential inner wall surfaces of certain of the holes to form via-holes 10, thereby electrically connecting the upper and lower copper film layers. Chip mounting section 12 and circuit patterns 4, including the bond fingers 4a and ball lands 4b, are formed by patterning the copper film layers. The chip mounting section 12, the circuit patterns 4 (except for bond fingers 4a and ball lands 4b), and the areas of upper and lower surfaces 2a, 2b surrounding the circuit patterns 4 are coated with a solder mask 8, which may be a polymer resin. Finally, the bond fingers 4a and ball lands 4b are electroplated with sequential layers of nickel (Ni) and gold (Au).

However, in making such a printed circuit board, in order to conduct the electroplating technique, the circuit patterns 4 must necessarily extend to peripheral edges of the printed circuit board, as shown in FIG. 7a. Because the circuit patterns 4 must be provided at the periphery of the printed circuit board to allow the electroplating to be conducted, it is difficult to freely design a dense and fine arrangement of the circuit patterns 4.

Moreover, bond fingers 4a are plated on their vertically extending peripheral side surfaces 5a (which are substantially perpendicular to the underlying surface of resin layer 2), as well as on their outer horizontal surfaces 5b, which are parallel to the underlying surface of resin layer 2. This plating on the peripheral side surfaces 5a bond fingers 4a reduces an adhesion force between bond fingers 4a and an encapsulating material subsequently applied over the circuit board 100' (including bond fingers 4a) and over the semiconductor chip.

To cope with such difficulties, another printed circuit board manufacturing method, which is known as a full body gold (FBG) plating method, may be used. Referring to printed circuit board 100" of FIGS. 8a and 8b, circuit patterns 4 of the printed circuit board were plated using the FBG method. The circuit patterns do not extend to the peripheral edges of the printed circuit board 100". Accordingly, a peripheral region of the upper and lower surfaces 2a, 2b of resin layer 2 around printed circuit board 100" is free of circuit patterns 4.

In the FBG manufacturing method, a plating layer 6 each having a predetermined thickness is formed in advance by electroplating nickel (Ni) and gold (Au) on predetermined regions of an unpatterned copper layer on the upper and lower surfaces of the resin layer 2. The plated regions correspond to the circuit patterns 4 that are to be formed later from the thin copper film layers. Thereafter, the upper and lower copper film layers are etched using the plating layers 6 as masks, thereby removing unnecessary portions of the copper film layers, and forming circuit patterns 4 that are plated over their entire outer horizontal surface 5b, including portions other than bond fingers 4a or ball lands 4b. Then, a solder mask 8 is coated on the upper and lower circuit patterns 4 in a manner such that the previously-plated bond fingers 4a and ball lands 4b are exposed to the outside.

However, the FBG-plated printed circuit board still suffers from defects in that, since the adhesion force between the solder mask 8 and the plating layer 6 is weak, the solder mask 8 can be easily stripped off from the circuit patterns 4. Accordingly, the operational reliability of the printed circuit board 100" can be seriously deteriorated. Further, since nickel (Ni) and gold (Au) are unnecessarily provided on portions of the horizontal outer surface 5b of the circuit patterns 4 other than bond fingers 4a and ball lands 4b, the cost to make printed circuit board 100" is unnecessarily high.

SUMMARY OF THE INVENTION

The present invention provides, among other things, a printed circuit board for a semiconductor package and a method for manufacturing the same. The present invention allows a highly integrated design of circuit patterns on the printed circuit board with improved reliability and cost savings by comparison to the conventional art described above.

One embodiment of a printed circuit board for a semiconductor package in accordance with the present invention includes a core layer having conductive circuit patterns formed thereon. The circuit patterns include (individually or collectively) bond fingers and ball lands. A solder mask is coated on the circuit patterns, except over the bond fingers and ball lands. A metal plating layer is provided only on the outer horizontal surfaces of the bond fingers, and not on other horizontal outer or side surfaces of the circuit patterns outside the bond fingers. The circuit patterns do not extend to an outer periphery of the circuit board. Accordingly, a complicated and dense layer of circuit patterns can be provided on the board, stripping of the solder mask from the circuit patterns can be avoided, waste of the plating metal is avoided, and adhesion between an encapsulant and the bond fingers can be enhanced.

The present invention also includes, among other things, a semiconductor package made with the various printed circuit boards of the present invention, and methods of making such packages.

The above and other aspects and features of the present invention will become more apparent from the detailed description and drawings of the exemplary embodiments.

BRIEF DESCRIPTION OF THE DRAWINGS

FIGS. 1b and 1c are alternate cross-sectional views of alternative configurations of circuit patterns taken along the line I—I of FIG. 1a.

FIG. 7b is a cross-sectional side view taken along the line II—II of FIG. 7a.

FIG. 8b is a cross-sectional side view taken along the line III—III of FIG. 8a.

DETAILED DESCRIPTION

Figure 1A:
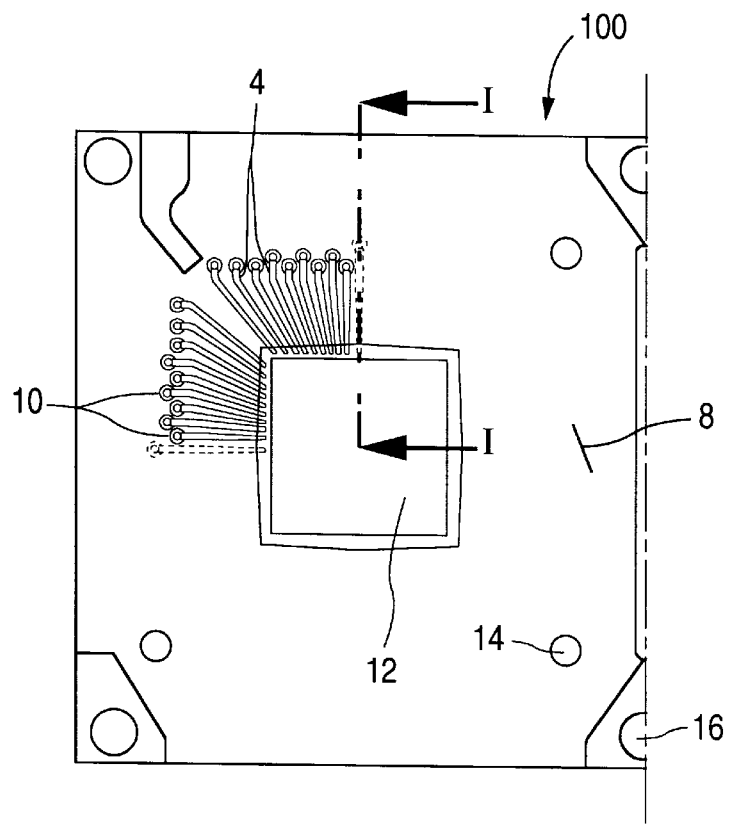
FIG. 1a is a top plan view of a printed circuit board for a semiconductor package in accordance with an exemplary embodiment of the present invention.

Reference will now be made in greater detail to exemplary embodiments of the invention. Wherever possible, the same reference numerals will be used throughout the drawings and the description to refer to the same or like parts.

Figure 1B:
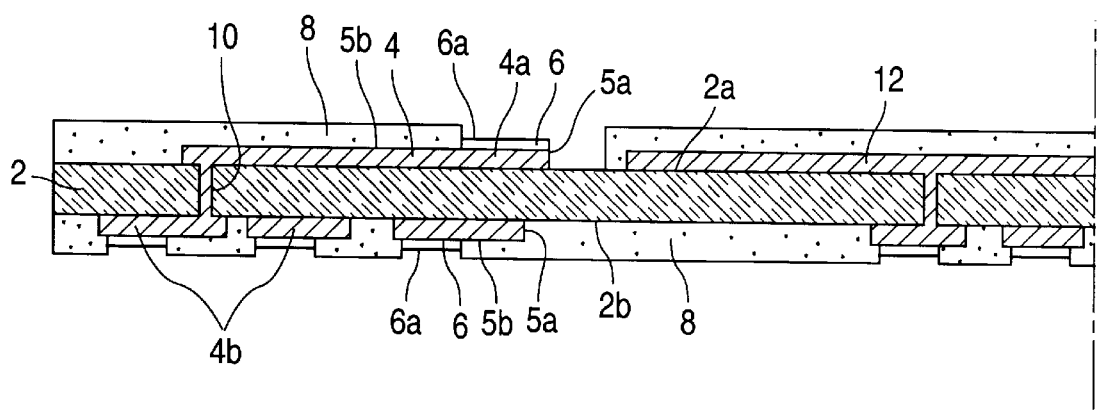
Figure 1C:
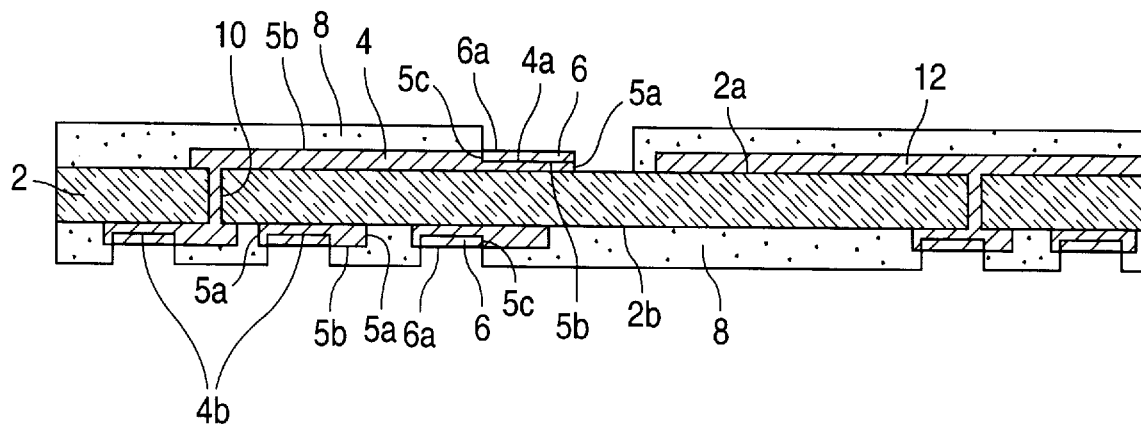

FIG. 1a is a top plan view illustrating a printed circuit board for a semiconductor package in accordance with an embodiment of the present invention. FIGS. 1b and 1c are cross-sectional views of alternative configurations taken along the line I—I of FIG. 1.

Referring to FIGS. 1a and 1b, printed circuit board 100 includes a resin layer 2 (made of a thermosetting resin composite, a film, a tape, or the like) that has opposing planar or substantially planar first and second surfaces 2a, 2b. A layer of conductive circuit patterns 4 that each include a bond finger 4a are formed on first surface 2a of the resin layer 2. Other circuit patterns 4 that each include a ball land 4b are formed on second surface 2b of the resin layer 2. The circuit patterns 4 may be formed of a thin metal layer, such as copper or aluminum. Copper will be the example herein.

In an alternative embodiment (not shown), circuit patterns 4 may be provided on only one of first and second surfaces 2a and 2b of resin layer 2. In such a case, the circuit patterns 4 would each include a bond finger 4a at one end and a ball land 4b at an opposite end of the circuit pattern 4.

Referring again to FIGS. 1a and 1b, the circuit patterns 4 that are formed on the first and second surfaces 2a and 2b of the resin layer 2 are electrically connected with each other by conductive via-holes 10 through resin layer 2. The entire length of the circuit patterns 4, excluding the bond fingers 4a and ball lands 4b, and the area of first and second surfaces 2a and 2b surrounding the circuit patterns 4 are coated with a solder mask 8. In other words, bond fingers 4a and ball lands 4b are exposed through apertures of the respective solder mask 8.

Also formed on first surface 2a of the resin layer 2 is a chip mounting section 12, which is at a predetermined separation from the bond fingers 4a. Chip mounting section 12 may be formed of the same metal as circuit patterns 4 (e.g., copper). The chip mounting section 12 is coated with solder mask 8.

A plating layer 6 of a predetermined thickness is formed on the exposed horizontal outer surfaces 5b of the bond fingers 4a and ball lands 4b. In a case where circuit patterns 4 are formed of copper, the plating layer 6 may include an inner layer of nickel (Ni) and an outer layer of gold (Au). The plating layer 6 is formed only on the horizontal outer surfaces 5b of the bond fingers 4a and ball lands 4b (which horizontal outer surfaces are parallel to the first and second surfaces 2a and 2b of the resin layer 2). Plating layer 6 is not formed on the remaining portion of the horizontal outer surface 5b of the circuit pattern 4 or on the vertically-extending peripheral surfaces 5a of the bond finger 4a (i.e., the surface that is between the outer horizontal surface 5b of the circuit pattern and the underlying surface 2a of resin layer 2). As a consequence, plating metal is saved and adhesion between the bond fingers 4a and an encapsulating material subsequently applied over first surface 2a and bond fingers 4a (see FIG. 5) is increased in comparison with the conventional art. Also, since the plating layer 6 is not formed on regions of the circuit patterns 4 other than the bond finger 4a and ball land 4b, the overlaid solder mask 8 is not prone to be stripped off the unplated copper portions of the circuit patterns 4.

Chip mounting section 12 is electrically connected by via-holes 10 through resin layer 2 to ball lands 4b on second surface 2b of resin layer 2. Those ball lands 4b also are plated with plating layer 6. In one package embodiment, conductive balls may ultimately be mounted on those ball lands 4b so that the chip mounting section 12 of a package can be attached to a heat sink or to a reference voltage of a motherboard.

Printed circuit board 100 may be formed as part of an array of like printed circuit boards on a large substrate sheet. Subsequently, after semiconductor packages are assembled on each of the interconnected printed circuit boards of the large substrate sheet, the large substrate may be cut with a saw or router to singulate individual packages. Alternatively, the printed circuit boards of the present invention may be made individually.

In an alternative embodiment of FIG. 1a that is shown in FIG. 1c, the copper base layer at each bond finger 4a and ball land 4b includes a recess 5c formed by a partial removal of the copper layer at that location. The plating layer 6 is in the recess 5c of the circuit pattern 4. The thickness of plating layer 6 can be selected such that a horizontal outer surface 6a of plating layer 6 is flush with an outer surface 5b of the adjacent unplated portions of the outer horizontal surface 5b of the circuit pattern 4. The plating layer 6 may be composed of layers of nickel and gold, among other possibilities. As in FIG. 1b, the plating layer 6 is formed only on the horizontal outer surface 5b of the respective bond finger 4a or ball land 4b, and is not formed on the remainder of the horizontal outer surface 5b of the circuit pattern 4 or on the vertically-extending peripheral surfaces 5a of the bond fingers 4a. This enhances adhesion between the bond fingers 4a and an encapsulant material subsequently applied over the semiconductor chip, bond wires and bond fingers 4a (see FIG. 6), as well as conserving the plating metal and enhancing adhesion between the solder mask 8 and the circuit pattern 4.

In summary, in the printed circuit board of FIG. 1b, the plating layer 6 at the respective bond finger 4a and ball land 4b is on top of the copper layer, and thus is positioned above first surface 2a of resin layer 2 higher than the horizontal outer surface 5b of the remaining unplated portions of the circuit patterns 4. On the other hand, in FIG. 1c, the outer horizontal surface 6a of plating layer 6 of bond finger 4a and ball land 4b is flush with the outer horizontal surface 5b of the adjacent unplated copper portions of the circuit patterns 4.

While the embodiments of FIGS. 1a, 1b, and 1c are described as including ball lands, in the sense that conductive balls or bumps (e.g., solder balls or bumps) may be applied thereon as input/output terminals of the semiconductor package to be made with printed circuit board 100, as in a ball grid array (BGA) package, practitioners will appreciate that such balls or bumps may be omitted, in which case the ball lands 4b may themselves be the input/output terminals of the package, as in a land grid array (LGA) package. (As used herein, "ball" includes "bump.")

FIGS. 2a through 2f are cross-sectional side views for explaining a method of manufacturing a printed circuit board in accordance with another embodiment of the present invention. For the sake of example, this exemplary method will be described in the context of making the printed circuit board shown in FIG. 1b, but, of course, the method is not so limited.

Figure 2A:
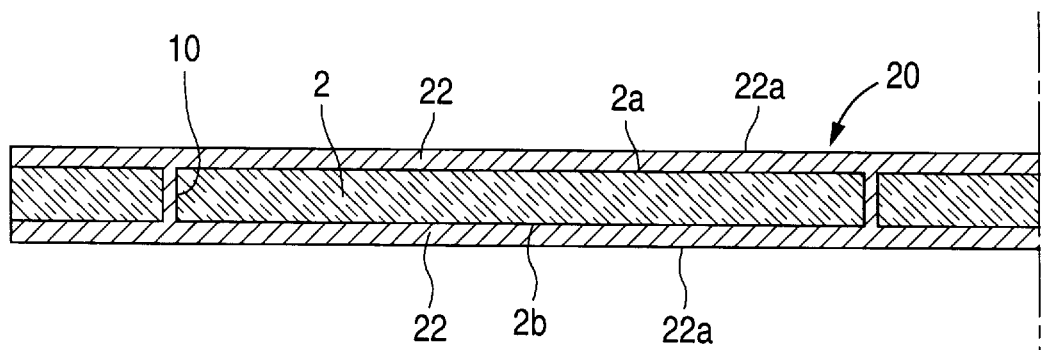
FIGS. 2a through 2f are cross-sectional side views of stages in an exemplary method for manufacturing the printed circuit board of FIGS. 1a and 1b.

Referring to FIG. 2a, a substrate 20 is prepared by attaching planar thin copper films 22 to the planar or substantially planar first and second surfaces 2a and 2b of the resin layer 2. As mentioned above, it can be contemplated that, in an alternative embodiment, a substrate 20 having a thin copper film 22 only on one of the first and second surfaces 2a and 2b of the resin layer 2 may be provided. The thin copper film 22 may be treated using a black oxidation process and may be laminated to resin layer 2 with a B-stage resin adhesive under conditions of high heat and pressure.

Where, as in FIG. 2a, thin copper films 22 are formed on the first and second surfaces 2a and 2b of the resin layer 2, conductive via-holes 10 are defined through the substrate 20 so as to electrically connect the thin copper film 22 on first surface 2a with the thin copper film on second surface 2b. Such via holes 10 may be formed by drilling through the thin copper films 22 and the resin layer 2, and plating the circumferential inner wall surface of the holes with copper or some other metal such that the thin copper films 22 are electrically connected with each other. Of course, where a thin copper film 22 is formed only on the one of the first and second surfaces 2a and 2b of the resin layer 2, this via-hole forming process is not needed.

Figure 2B:
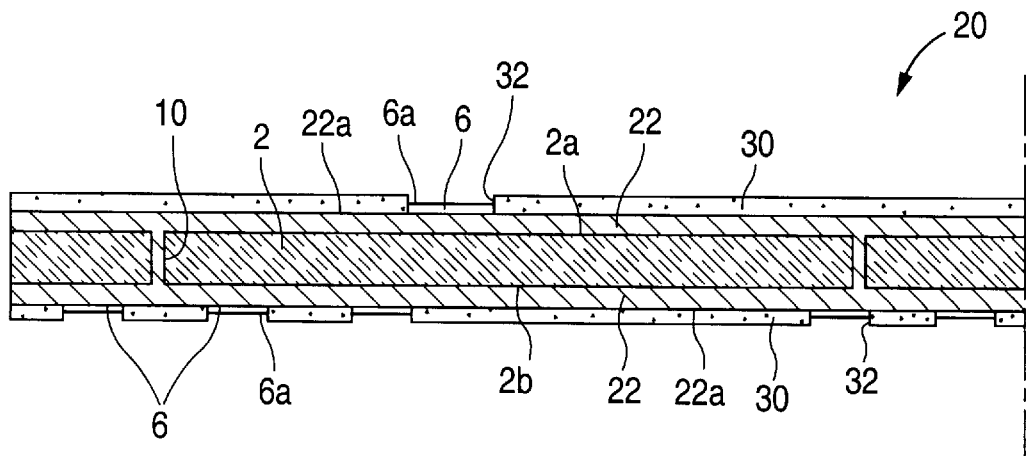

Referring to FIG. 2b, a plating layer 6 is formed only on those regions of the upper, horizontal surface 22a copper film layer 22 that will later be a bond finger 4a or ball land 4b. To form the plating layer 6, a photoimageable first film 30 is provided as a mask on each copper film 22. In this example, a copper layer 22 is on both the first and second surfaces 2a and 2b of resin layer 2 of substrate 20. Each first film 30 has through-holes 32 for allowing the bond fingers 4a and/or ball lands 4b to be formed later. First film 30 may be an acrylic based resin material. Subsequently, nickel (Ni) and gold (Au) are plated through the through-holes 32 onto the exposed horizontal outer surface 22a of the thin copper film 22, using an electroplating technique or an electroless plating technique. Plating layers 6 each have a predetermined thickness. Accordingly, the horizontal outer surface 22 of the regions of the copper film 22 that will ultimately be formed into bond fingers 4a and/or ball lands 4b are each plated with a plating layer 6 before copper film 22 is patterned by etching or the like. Subsequently, first film layer 30 is removed.

Of course, in the case (not shown) where the thin copper film 22 is formed only on the one of the first and second surfaces 2a and 2b of the resin layer 2, only one first film 30 is applied, and that first film 30 will include through-holes 32 for plating the bond finger 4a and ball land 4b of each of the circuit patterns 4 that are to be defined in a subsequent step.

Figure 2C:
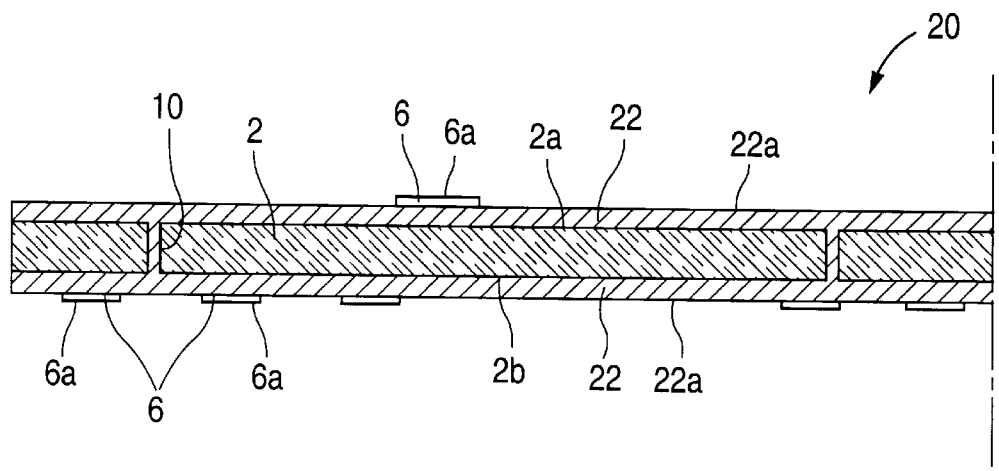

FIG. 2c shows a state of substrate 20 after plating layer 6 is applied onto the horizontal outer surface 22a the appropriate regions of the copper film 22, and after first film 30 is removed. As shown, plating layer 6 is on selected portions of the horizontal outer surface 22a of the copper film layer 22.

Figure 2D:
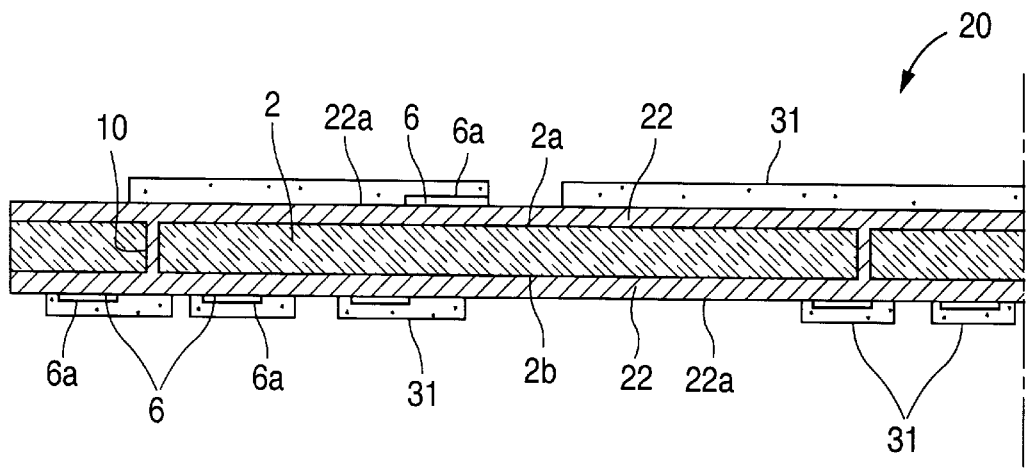
Figure 2E:
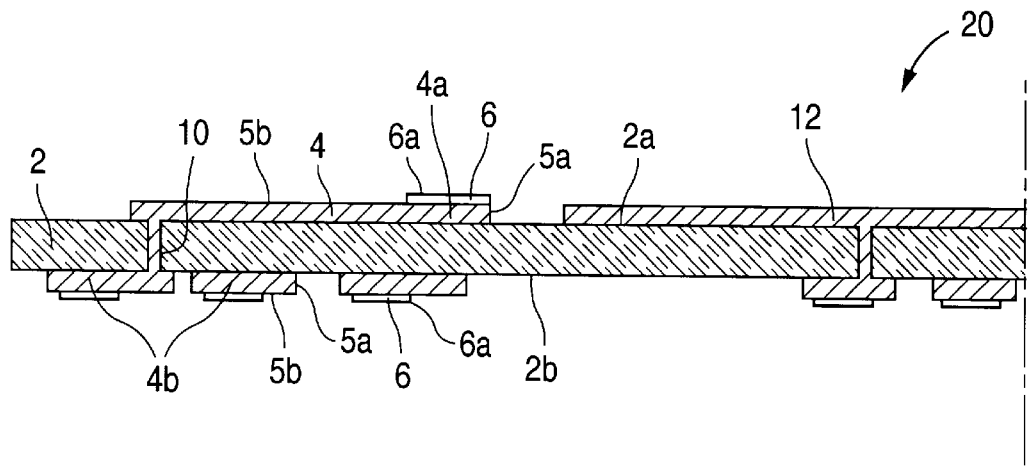
Figure 2F:
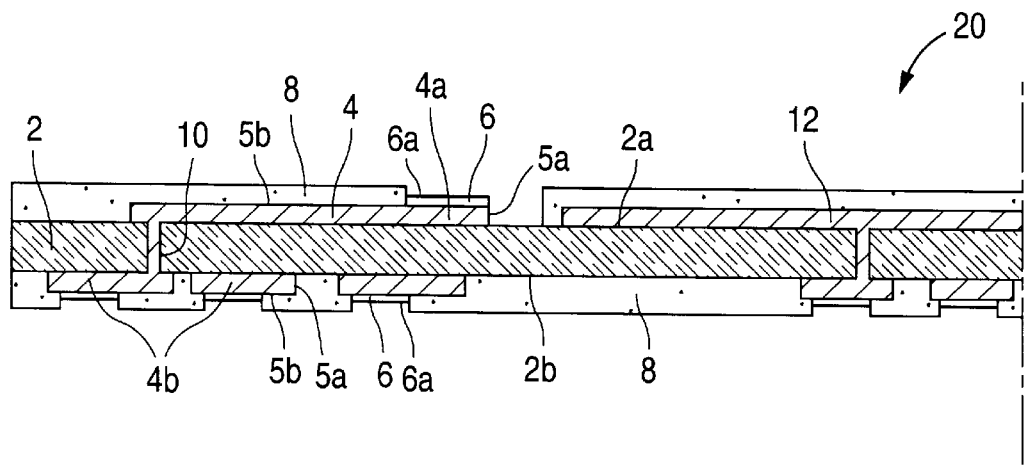

Referring now to FIG. 2d, another photoimageable masking layer, denoted as second film 31, is applied onto the thin copper layer 22 on the first and second surfaces 2a and 2b of resin layer 2. Second film layer 31 covers those portions of the horizontal outer surface 22a of each copper layer 22 that are to remain after the patterning step as circuit patterns 4, including the bond finger and ball land portions that were previously plated with plating layer 6. Unmasked portions of each copper film 22 are removed by the etchant. The portion of horizontal outer surface 22a of the copper layer 22 of first surface 2a that will form chip mounting section 12 (see FIG. 1) also is masked by second film layer 31. Subsequently, an etching solution is applied onto substrate 20. The etchant etches the copper layers 22 through apertures in each second film layer 20, thereby forming circuit patterns 4, each of which includes a pre-plated bond finger 4a and/or ball land 4b (see FIG. 2e), and chip mounting region 12.

After the second films 30 are removed, a layer of a solder mask 8 is coated on the circuit patterns 4 of the upper and lower surfaces of substrate 20 (See FIG. 2f), other than the bond fingers 4a and ball lands 4b, as well as on the surrounding surface portions of first and second surfaces 2a, 2b of resin layer 2 on which the circuit patterns 4 are not formed.

Referring again to FIG. 2e, it will be observed that plating layer 6 is like a step on the horizontal outer surface 5b of circuit patterns 4. Plating layer 6 is not flush with the horizontal outer surface 5b of the adjacent unplated copper portions of circuit patterns 4, but rather is on top of the copper layer at the bond finger 4a or ball land 4b regions of the circuit pattern 4.

Figure 3A:
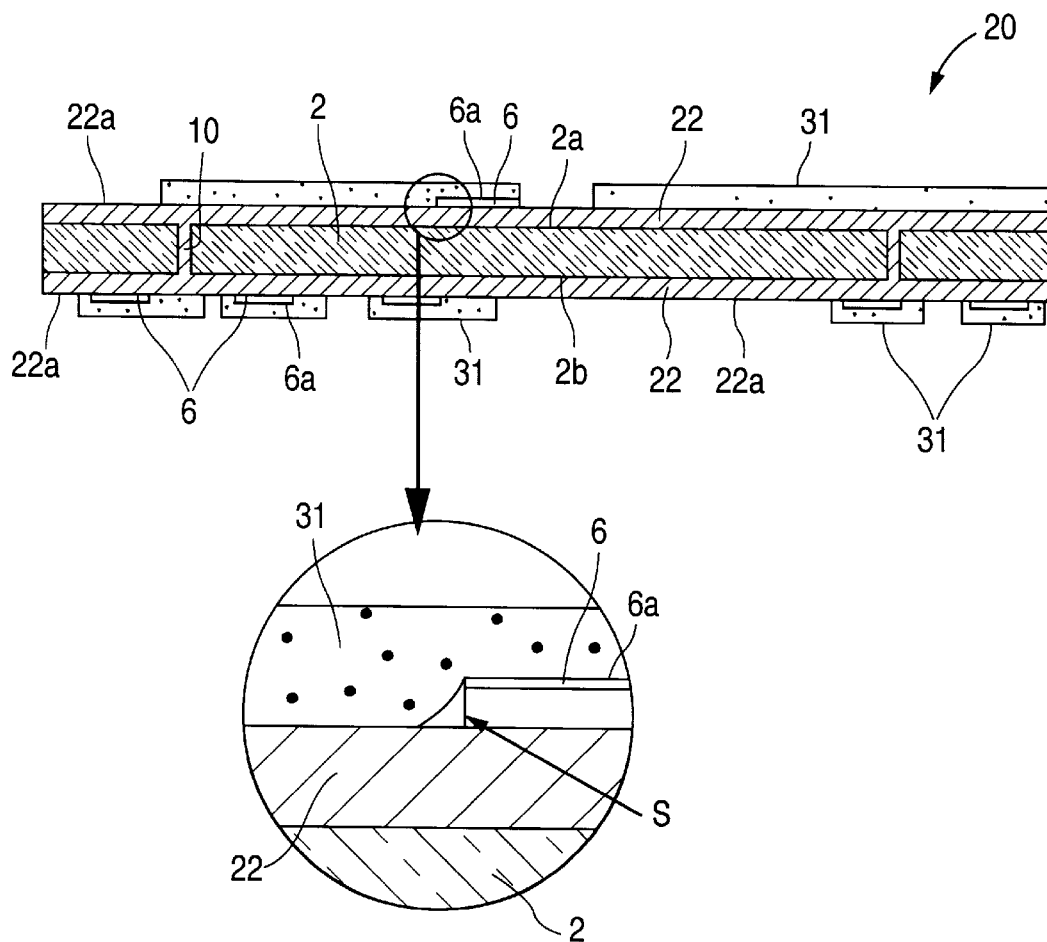
FIGS. 3a and 3b are partially enlarged cross-sectional views illustrating potential defects that may be observed in the course of performing the method as shown in FIGS. 2a through 2f.
Figure 3B:
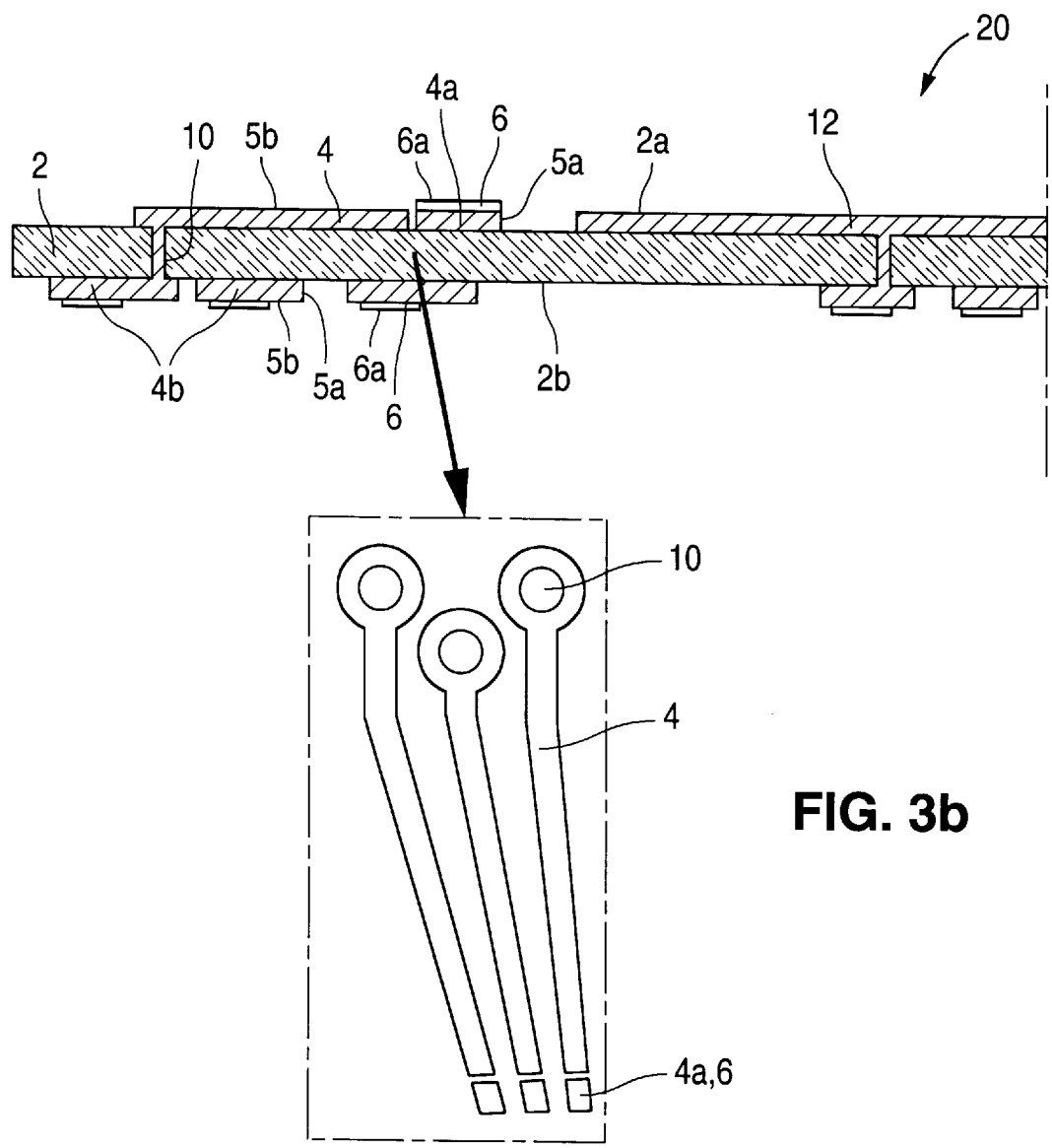

In some cases of performing the above process, it may be observed that, when applying second masking layer 31 (FIG. 2d), a space "s" may be formed at boundary regions between the plating layer 6 and the thin copper film 22 overlaid by second masking layer 31, as shown in FIG. 3a. If this happens, then during an etching process for forming the circuit patterns 4, the bond fingers 4a and ball lands 4b may be disconnected from the remaining portions of the circuit patterns 4, as shown in FIG. 3b. In other words, since the etching solution flows into the space s, the bond finger 4a and ball land 4b can be isolated from the remaining portions of the circuit pattern 4.

This potential defect can be solved by a method for manufacturing a printed circuit board in accordance with still another embodiment of the present invention, as described below with reference to FIGS. 4a through 4g. For the sake of example, the process will be discussed in the context of making the printed circuit board of FIG. 1c.

Figure 4A:
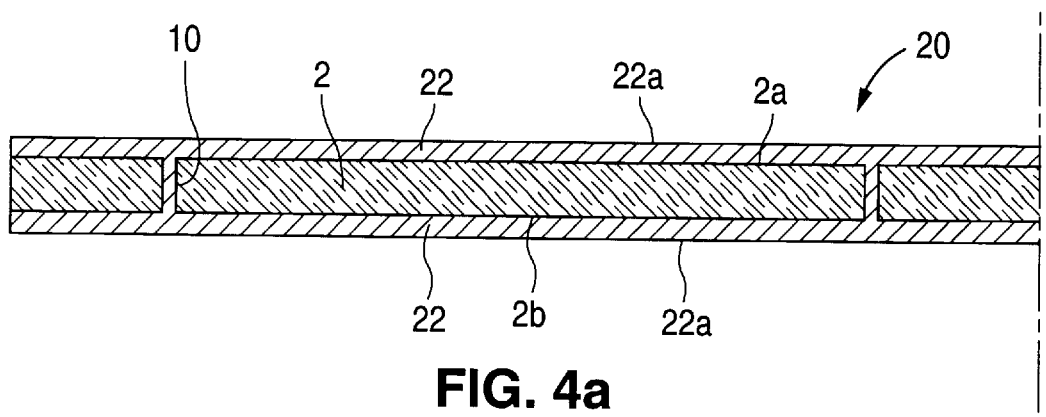
FIGS. 4a through 4g are cross-sectional side views of stages in another exemplary method for manufacturing the printed circuit board of FIGS. 1a and 1c.

FIG. 4a illustrates a step of providing a substrate 20, which is prepared by forming a thin copper film 22 on each of the opposing planar or substantially planar first and second surfaces 2a and 2b of a core resin layer 2. Again, in an alternative embodiment, such a substrate may be provided with a thin copper film 22 only on one of the first and second surfaces 2a and 2b of the resin layer 2. Such an embodiment has no need for via holes.

Returning to FIG. 4a, conductive via-holes 10 are provided through substrate 20 so as to electrically connect the opposing planar thin copper films 22 respectively formed on the first and second surfaces 2a and 2b of the resin layer 2 with each other. Such via-holes 10 may be defined by forming a hole (e.g., by drilling or laser) through the thin copper films 22 and the resin layer 2, and plating or otherwise conductively coating the circumferential inner wall surface of the holes such that the thin copper films 22 on the first and second surfaces 2a and 2b of the resin layer 2 are electrically connected.

Figure 4B:
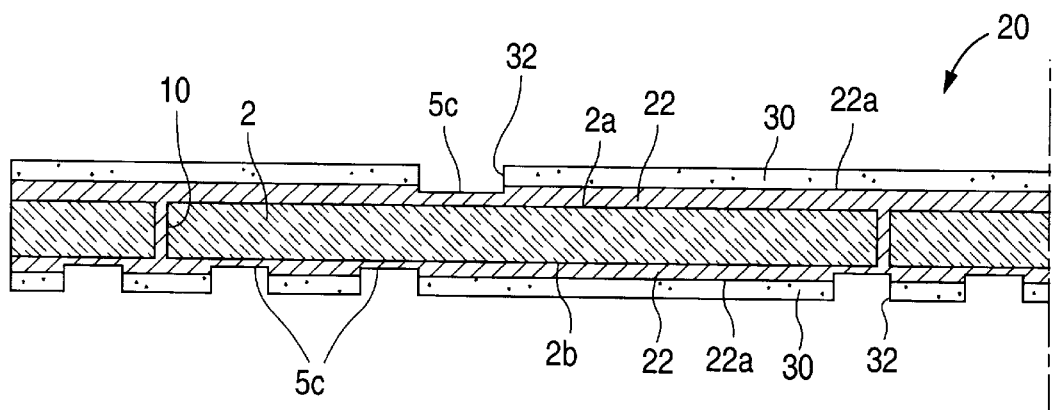

FIG. 4b reflects a partial etch step, sometimes called a half-etch step, that etches only a partial distance vertically into the two copper films 22. In such a step, a photoimageable mask formed of a first film 30, which has through-holes 32, is formed on the horizontal outer surface 22a of each copper film 22. Through-holes 32 are provided through first film 30 over the regions of the respective thin copper film 22 where bond fingers 4a and/or ball lands 4b will be formed later. An etchant is applied to the respective thin copper film 22 through the through-holes 32 in the respective first film 30. The etching is allowed to proceed until, for example, substantially half of the thickness of the thin copper film 22 is removed at the selected regions, as shown in FIG. 4b, so as to form a recess 5c at each through-hole 32. Again, each recess 5c corresponds to a bond finger 4a or ball land 4b to be formed later. For example, when the thickness of the thin copper film 22 is about 30 μm, the depth of each recess 5c is about 15 μm.

Of course, where a thin copper film 22 is formed only on one of the first and second surfaces 2a and 2b of the resin layer 2, then only that one thin copper film 22 is masked with a first film 30 and subjected to the partial etch. The partial etch step forms recesses 5c in the single copper film 22 so that bond fingers 4a and ball lands 4b may be formed at those locations in a subsequent step.

Figure 4C:
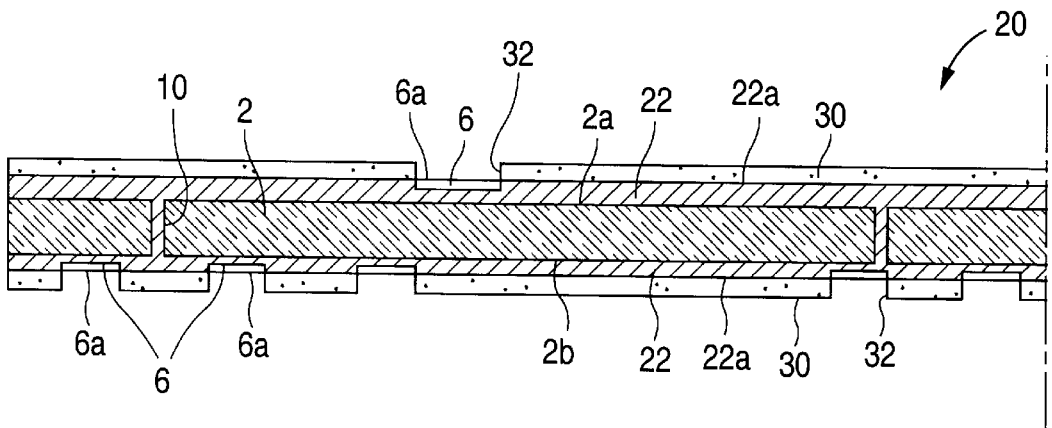
Figure 4D:
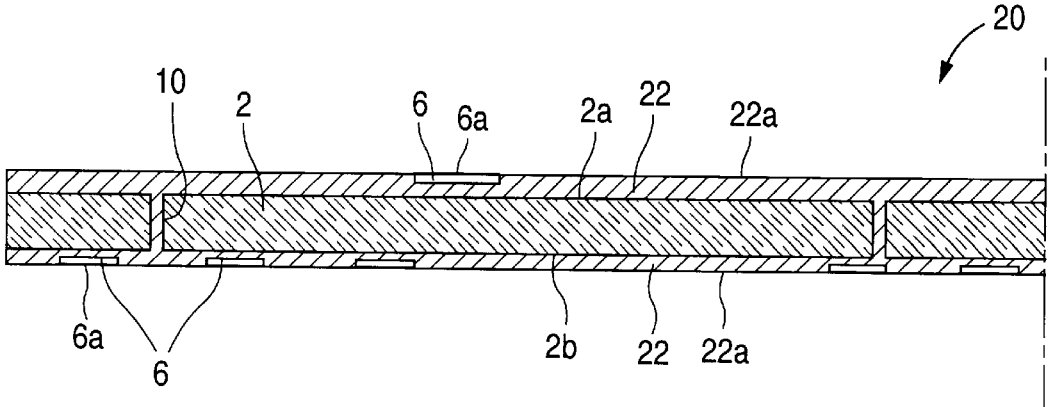

Subsequently, as shown in FIG. 4c, nickel (Ni) and gold (Au) layers (or some other metal layer(s)) are sequentially plated into each recess 5c through the overlying through-holes 32 of the respective first films 30 using an electro- plating technique or an electroless plating technique. A plating layer 6 having a predetermined thickness is thereby formed on the partially-etched surface of the horizontal or substantially horizontal outer surface 22a of the thin copper film 22 within each recess 5c (i.e., at the future locations of the bond fingers and ball lands).

In the example of FIG. 4c, each recess 5c is filled with the plating layer 6 until the horizontal outer surface 6a of the plating layer 6 is flush with the horizontal outer surface 22a of the thin copper film 22. For example, in a case where the depth of each recess 5 is 15 μm, a thickness of each plating layer 6 is 15 μm. Accordingly, the outer horizontal surface 6a of the plating layer 6 is made flush with the outer horizontal surface 22a of the unplated thin copper film 22. Subsequently, first film 30 is removed (see FIG. 4d).

Figure 4E:
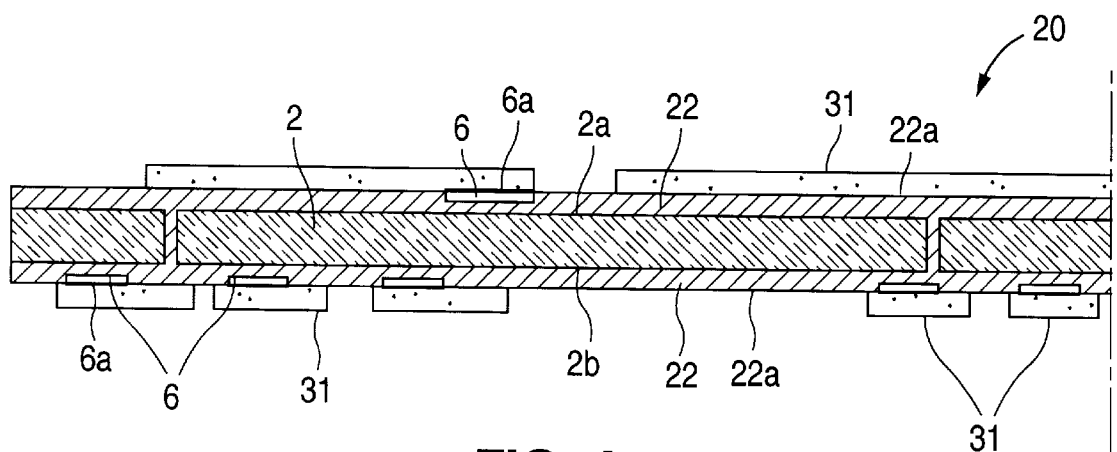

Referring to FIG. 4e, another photoimageable masking layer, denoted as second film 31, is provided on each of the upper and lower thin copper films 22. Second film 31 is patterned with apertures so as to define the circuit patterns 4 each including a bond finger 4a and/or a ball land 4b, that are to be formed from each thin copper film 22. In other words, each second film 31 masks those portions of the overlaid copper film 22 that are to form the circuit patterns 4, and exposes metal to be removed by the patterning step. Next, an etching solution is applied onto the substrate 20. The etching solution etches thin copper films 22 through the apertures in second film 31. Accordingly, excess metal is removed (see FIG. 4f). After which, second film layer 32 is removed.

Figure 4F:
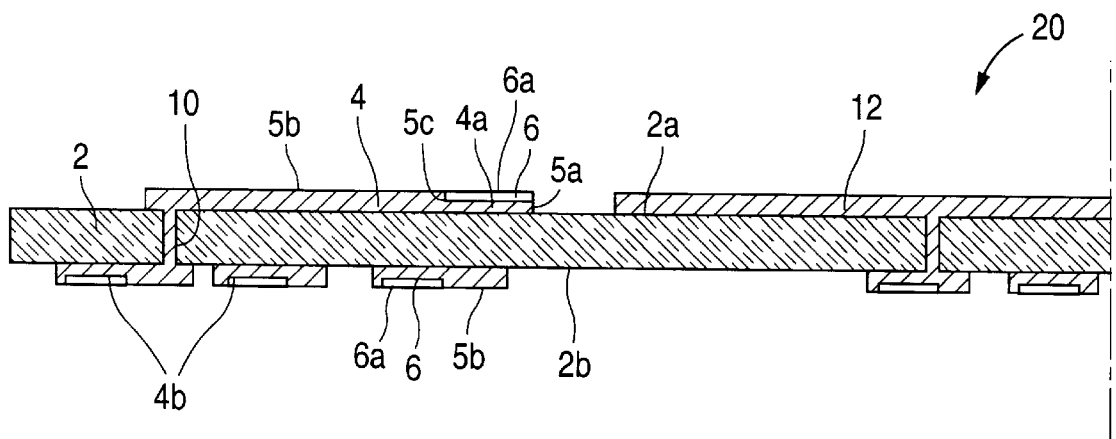
Figure 4G:
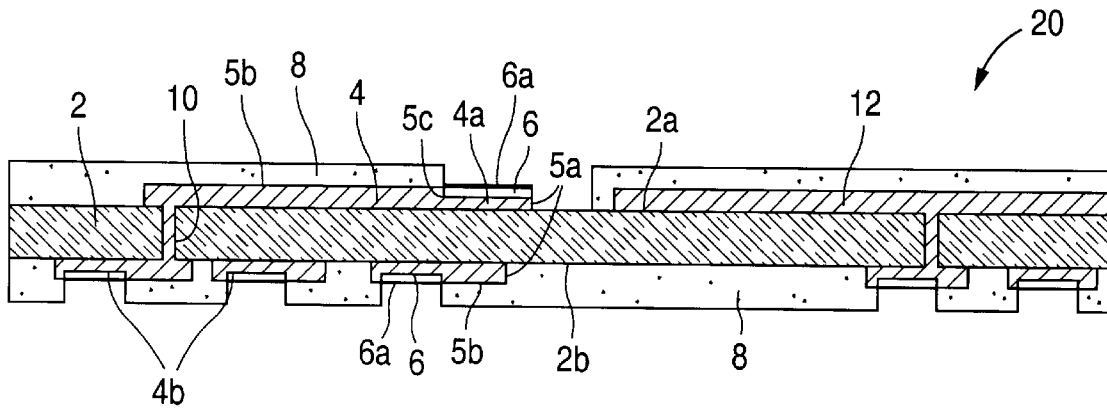

As can be seen from FIG. 4f, the outer horizontal surface of each plating layer 6 is in the same horizontal plane as the horizontal outer surface 5b of the unplated remainder of the respective circuit pattern. Accordingly, the horizontal outer surface 6a of the plating layer of the bond fingers 4a and the ball lands 4b are flush with the unplated horizontal outer surface 5b of the remainder of the circuit pattern 4. Further, the plating layer 6 is provided only where it is desired, i.e., on the horizontal outer surfaces 5b of the bond finger 4a and/or ball land 4b of the circuit pattern 4, and not over the entire length of the circuit pattern 4, as in the FBG method of the conventional art. Further, the peripheral sides surfaces 5a of the bond fingers 4a and ball lands 4b are not plated with the material of plating layer 6. Further, such localized plating is done without the need for portions of the circuit patterns 4 to extend to the periphery of the circuit board. The plating metal therefore is not wasted, and adhesion to the solder mask and the encapsulant are improved.

In addition, as can be readily seen from FIG. 4c, the outer horizontal surface of each plating layer 6 and the thin copper films 22 are flush with each other prior to the application second film 31. The second film 31 therefore can be uniformly and closely attached to the plating layer 6 and the thin copper films 22. Since there is no step between the plating layer 6 and the horizontal outer surface 22a of the thin copper film layer 22, as was present in FIG. 2d, the aforementioned space s (see FIG. 3a) is not given an opportunity to form. Accordingly, the possible open circuit phenomenon of FIG. 3b between the bond fingers 4a and ball lands 4b and the circuit patterns 4 does not occur.

After the second films 31 are removed, a layer of a solder mask 8 is coated on the circuit patterns 4 of the upper and lower surfaces 2a and 2b of resin layer 2, excluding the bond fingers 4a and ball lands 4b. The adjacent surface portions of first and second surfaces 2a and 2b of the resin layer 2 where circuit patterns 4 are not formed also are coated. Accordingly, the plated bond fingers 4a and/or ball lands 4b are exposed out of the respective solder masks 8 (see FIG. 4g).

Figure 5:
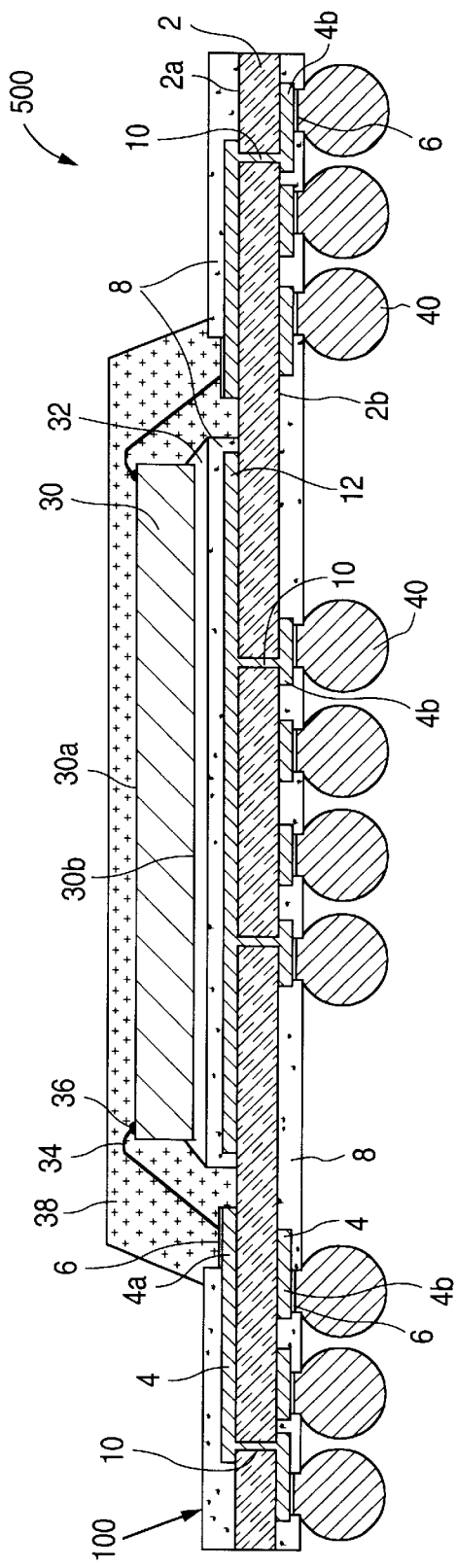
FIG. 5 is a cross-sectional side view of an exemplary semiconductor package made using the printed circuit board of FIGS. 1a and 1b.
Figure 6:
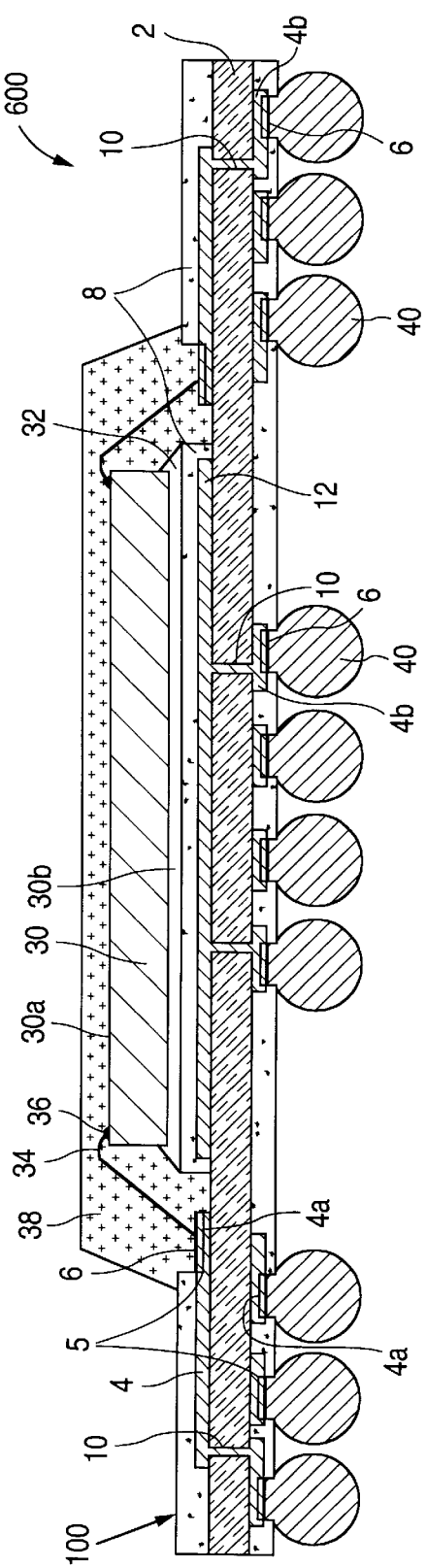
FIG. 6 is a cross-sectional side view of an exemplary semiconductor package made using the printed circuit board of FIGS. 1a and 1c.
Figure 7A:
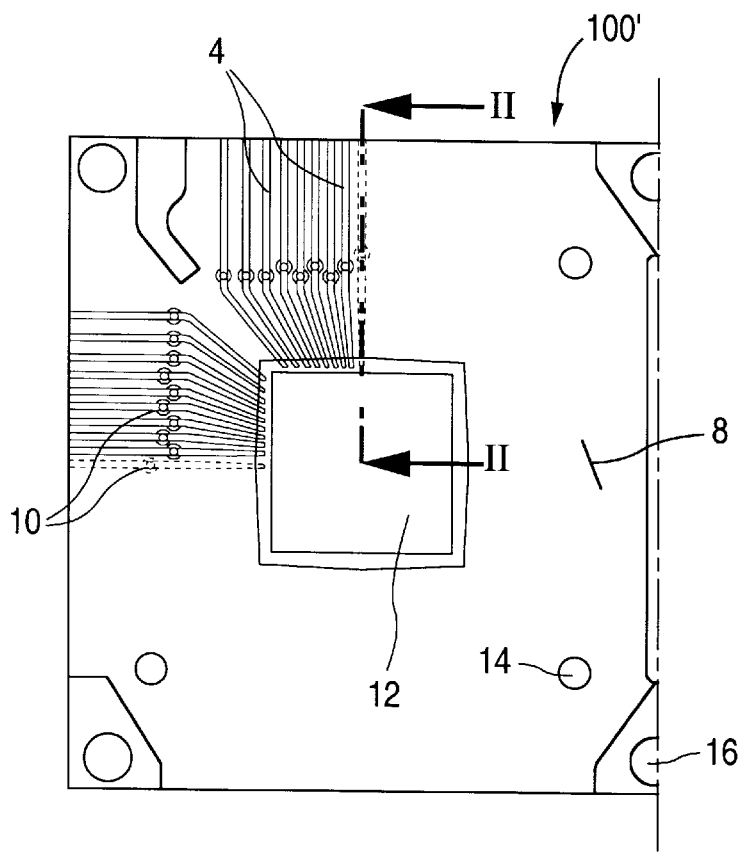
FIG. 7a is a top plan view illustrating a conventional printed circuit board for a semiconductor package.
Figure 7B:
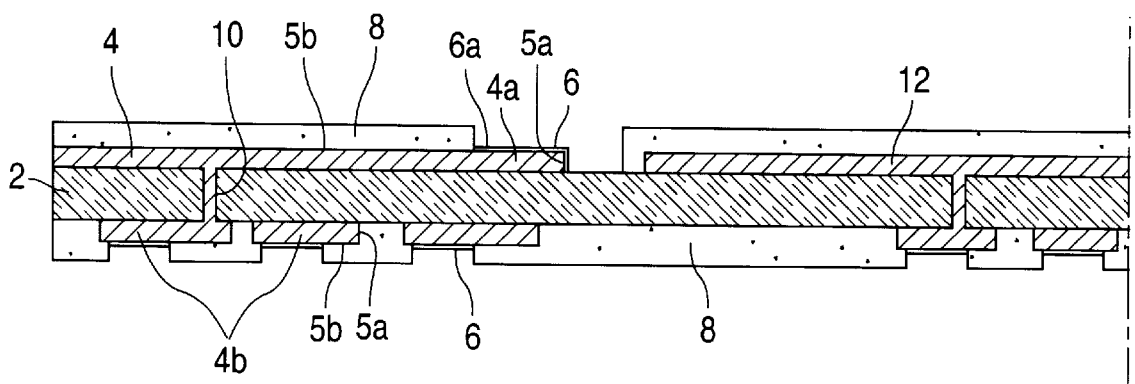
Figure 8A:
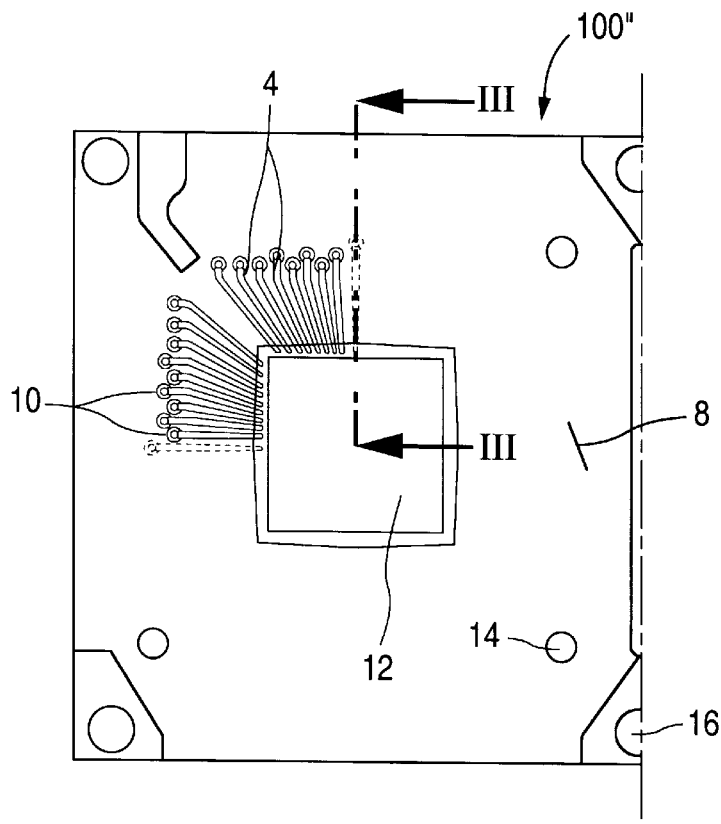
FIG. 8a is a top plan view illustrating another conventional printed circuit board for a semiconductor package.
Figure 8B:
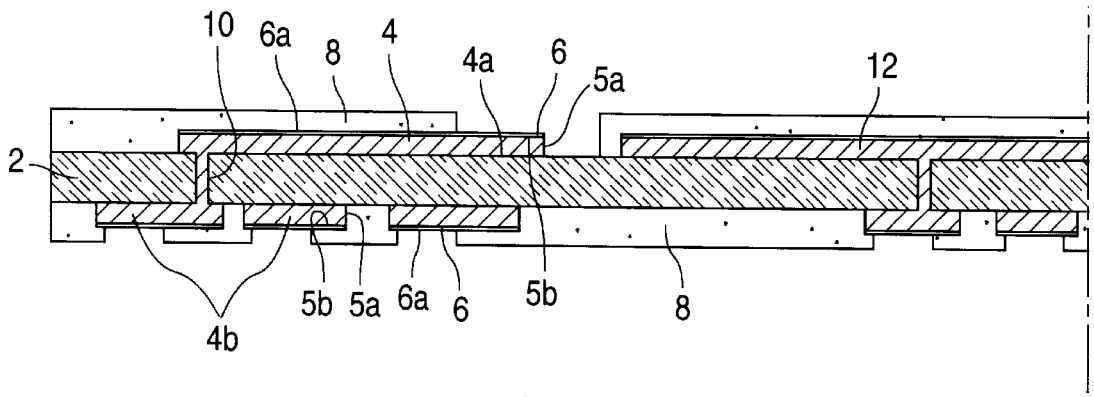

FIGS. 5 and 6 are cross-sectional side views of exemplary semiconductor packages in accordance with the present invention. In particular, package 500 of FIG. 5 includes a printed circuit board 100 as in FIGS. 1a and 1b, and package 600 of FIG. 6 includes a printed circuit board 100 as in FIGS. 1a and 1c. As mentioned above, a difference between the respective circuit boards 100 of FIGS. 5 and 6 (i.e., of FIGS. 1b and 1c) is the provision in FIG. 6 plating layer 6 in a recess 5c formed in the copper base of the circuit patterns 4 at the bond finger 4a or ball land 4b.

Package 500, 600 includes a semiconductor chip 30 that is placed on and is adhesively coupled to the printed circuit board 100 of the package. Chip 30 includes an active surface 30a and an opposite inactive surface 30b. Inactive surface 30b of chip 30 is juxtaposed with and adhesively connected with a thermally and/or electrically conductive adhesive 32 (or some other adhesive) to the layer of solder mask 8 that is provided on chip mounting section 12 on first surface 2a of resin layer 2.

A plurality of bond wires 34, which may be formed of gold or aluminum, are each electrically connected between one of a plurality of bond pads 36 on active surface 30a of chip 30 and the plating layer 6 of the bond finger 4a of one of the circuit patterns 4 on first surface 2a of resin layer 2 of the printed circuit board 100.

A hardened insulative encapsulant 38, which may be formed by molding a resin material, is formed over chip 2, bond wires 34, and the inner sub-portion of first surface 2a of resin layer 2 around chip 30, including over the plated bond fingers 4a. Encapsulant 38 forms a housing for chip 2.

A plurality of optional conductive balls 40 are each fused to the plating layer 6 of the ball land 4b of one of the circuit patterns 4 of second surface 2b of resin layer 2 of the printed circuit board 100. Each conductive ball 40 serves either as an input/output terminal for communicating signals to and from chip 2, or serves as a means for thermally or electrically coupling chip mounting section 12 to a heat sink, reference voltage, or the like of a motherboard.

Practitioners will appreciate that many variations of semiconductor packages may be made with the printed circuit boards of the present invention. For example, instead of having bond wires, other conductors, such as TAB bonds, may be used. Likewise, chip 30 may be mounted in a flip chip style on bond fingers 4a, and a conductor such as solder or a conductive adhesive may be used to electrically connect the bond pads 36 to the bond fingers 4a. Likewise, chip 30 may be suspended in an aperture of the circuit board by the hardened encapsulant material. Likewise, encapsulant 38 may be: (1) formed over more or all of first surface 2a of resin layer 2; (2) may have an internal cavity in which chip 2 is provided; (3) may be a poured liquid encapsulant material rather than a molded resin; or (4) may be omitted in place of a cap formed of metal or some other material that is placed over chip 30. As a final example, the circuit patterns 4 on first surface 2a may include both bond fingers 4a and ball lands 4b so that the package may be stacked with another like package. Likewise, conductive balls 40 may be omitted so as to form a land grid array package. Accordingly, FIGS. 5 and 6 are exemplary only. Further, the techniques of the present invention may be applied to printed circuit boards beyond those in semiconductor packages.

The respective exemplary embodiments of a printed circuit board for a semiconductor package and the various methods for manufacturing the same described herein include numerous desirable features. For example, a stripping phenomenon between the solder mask and circuit patterns is markedly lessened in comparison with the stripping seen with the printed circuit board made using the conventional FBG plating method. In other words, adhesion of the solder mask to the overlaid portions of the circuit patterns is improved. In addition, the circuit patterns 4 of the exemplary embodiments do not extend to the edges of the circuit board (compare FIGS. 1a, 1b, and 1c to FIGS. 7a and 7b), which can allow designing of complicated and fine circuit patterns having bond fingers and ball lands and, if necessary, via-holes. The periphery region around the circuit board is free of circuit patterns. Further, since a reduced amount of valuable plating metal, such as nickel (Ni) and gold (Au), is used in comparison to the conventional FBG plating method, manufacturing cost is also decreased.

Also, in some embodiments, because the regions of the metal layer(s) where the bond fingers and ball lands are to be formed are partially etched so as to form recesses, and the plating layer is formed in the recesses such that an outer horizontal surface of each plating layer is flush with an unplated outer surface of a remaining portion of the corresponding circuit pattern, the potential for an open circuit between a bond finger or ball land and the rest of the circuit pattern is lessened, whereby operational reliability of the printed circuit board can be improved.

In the drawings and specification, there have been disclosed various embodiments of the invention. Of course, these embodiments are exemplary only. Further, although specific terms may be employed, they are used in a generic and descriptive sense only and not for purposes of limitation. Accordingly, the scope of the invention includes all that falls within the literal and equitable scope of the claims.

What is claimed is:

1. A printed circuit board for a semiconductor package, comprising:

a substrate having a first surface and a chip mounting region;

a layer of metal circuit patterns on the first surface, each said circuit pattern having a planar outer surface parallel to the first surface, a bond finger at an inner end of the circuit pattern near the chip mounting region, and a peripheral side surface extending around the entire circuit pattern between the planar outer surface of the circuit pattern and the first surface, wherein the planar outer surface of the circuit pattern at the bond finger is covered by a layer of a plating metal, and a remaining portion of the planar outer surface of the circuit pattern outward of the bond finger and a peripheral side surface of the circuit pattern are devoid of the plating metal; and a layer of a solder mask coated on the first surface and the circuit patterns excluding the bond fingers.

2. The printed circuit board as claimed in claim 1, wherein the circuit patterns include a recess in the planar outer surface at the bond finger, and the layer of the plating metal is within the recess.

3. The printed circuit of claim 2, wherein an outer surface of the layer of the plating metal within the recess is flush with the unplated remaining portion of the circuit pattern.

4. The printed circuit board of claim 1, wherein the circuit patterns do not extend to a perimeter of the printed circuit board.

5. A semiconductor package comprising:

a substrate having a first surface, a layer of metal circuit patterns on the first surface, each said circuit pattern having a planar outer surface parallel to the first surface, a peripheral side surface entirely around the circuit pattern and extending between the planar outer surface of the circuit pattern and the first surface, and a bond finger at an inner end of the circuit pattern, wherein the planar outer surface of the circuit pattern at the bond finger is covered by a layer of a plating metal, and a remaining portion of the planar outer surface of the circuit pattern outward of the bond finger and the peripheral side surface of the circuit pattern are devoid of the plating metal;

a layer of a solder mask coated on the first surface and the circuit patterns excluding the bond fingers;

a semiconductor chip coupled to substrate; and a plurality of electrical conductors each electrically connected between the semiconductor chip and the layer of the plating metal at the bond finger of a respective one of the circuit patterns.

6. The semiconductor package as claimed in claim 5, wherein the circuit patterns include a recess in the planar outer surface at the bond finger, and the layer of the plating metal is within the recess.

7. The semiconductor package of claim 6, wherein an outer surface of the layer of the plating metal within the recess is flush with the unplated remaining portion of the circuit pattern.

8. The semiconductor package of claim 5, wherein the circuit patterns do not extend to a perimeter of the substrate.

9. The semiconductor package of claim 8, further comprising a hardened encapsulant material over first surface of the substrate, the chip and the circuit patterns.

10. A semiconductor package comprising:

a substrate having a first surface with a layer of metal circuit patterns thereon, said circuit patterns being entirely inward of a perimeter of the substrate, each said circuit pattern having a planar outer surface parallel to the first surface, a peripheral side surface entirely around the circuit pattern and extending between the planar outer surface of the circuit pattern and the first surface, and a bond finger at an inner end of the circuit pattern, wherein the planar outer surface of the circuit pattern at the bond finger is covered by a layer of a plating metal, and a remaining portion of the planar outer surface of the circuit pattern outward of the bond finger and the peripheral side surface of the circuit pattern are devoid of the plating metal;

a layer of a solder mask on the first surface and the circuit patterns excluding the respective bond fingers;

a semiconductor chip coupled to the substrate; and a plurality of bond wires each electrically connected between the semiconductor chip and the layer of the plating metal at the bond finger of the respective circuit patterns.

11. The semiconductor package as claimed in claim 10, wherein the circuit patterns include a recess in the planar outer surface at the bond finger, and the layer of the plating metal is within the recess.

12. The semiconductor package of claim 11, wherein an outer surface of the layer of the plating metal within the recess is flush with the unplated remaining portion of the circuit pattern.

13. A method of manufacturing a printed circuit board for a semiconductor package, comprising the steps of:

providing a substrate having a first surface; and forming a layer of metal circuit patterns on the first surface, said circuit patterns being entirely inward of a perimeter of the substrate, each said circuit pattern having a planar outer surface parallel to the first surface, a peripheral side surface entirely around the circuit pattern and extending between the planar outer surface of the circuit pattern and the first surface, and a bond finger at an inner end of the circuit pattern, wherein the planar outer surface of the circuit pattern at the bond finger is covered by a layer of a plating metal, and a remaining portion of the planar outer surface of the circuit pattern outward of the bond finger and the peripheral side surface of the circuit pattern are devoid of the plating metal.

14. The method of claim 13, further comprising applying a layer of a solder mask on the first surface and the circuit patterns, excluding the respective bond fingers.

15. The method of claim 13, wherein forming the layer of the metal circuit patterns comprises:

providing the substrate with a metal layer on the first surface of the substrate;

plating first regions of the metal layer with said plating metal without plating other regions of the metal layer; and subsequently patterning the metal layer to form the circuit patterns and the bond fingers thereof, with the plated first regions each overlying the bond finger of one of the circuit patterns so formed.

16. The method of claim 15, further comprising:

forming a plurality of recesses in an outer surface of the metal layer;

plating within the recesses, thereby forming the plated first regions.

17. The method of claim 13, wherein the layer of the plating metal is in a recess in the planar outer surface of the circuit pattern.

18. The method of claim 13, wherein forming the layer of the metal circuit patterns comprises:

providing the substrate with a metal layer on the first surface of the substrate;

applying a first mask on the metal layer, said first mask having first apertures;

plating first regions of the metal layer through said first apertures, wherein other regions of the metal layer are not plated;

removing said first mask;

applying a second mask on the metal layer and over the plated first regions, said second mask having second apertures;

patterning the metal layer through said second apertures to form said circuit patterns, with the plated first regions each overlying the bond finger of a respective one of the circuit patterns so formed; and removing the second mask.

19. A method of manufacturing a semiconductor package, comprising the steps of:

providing a substrate having a first surface with a layer of metal circuit patterns thereon, each said circuit pattern having a planar outer surface parallel to the first surface, a peripheral side surface entirely around the circuit pattern and extending between the planar outer surface of the circuit pattern and the first surface, a bond finger at an inner end of the circuit pattern, wherein the planar outer surface of the circuit pattern at the bond finger is covered by a layer of a plating metal, and a remaining portion of the planar outer surface of the circuit pattern outward of the bond finger and the peripheral side surface of the circuit pattern are devoid of the plating metal, and a layer of a solder mask on the first surface and the circuit patterns excluding the bond fingers; and coupling a semiconductor chip to the substrate;

providing a plurality of electrical conductors, and electrically connecting each of said electrical conductors between the semiconductor chip and the layer of the plating metal at the bond finger of a respective one of the circuit patterns.

20. The method of claim 19, wherein the substrate has a perimeter, and the circuit patterns are entirely inward of the perimeter.

21. The method of claim 20, further comprising applying an encapsulant material over the first surface, the semiconductor chip, and the circuit patterns.

22. The method of claim 20, wherein the circuit patterns each include a recess in the planar outer surface at the bond finger, and the layer of the plating metal is within the recess.

23. The method of claim 22, wherein an outer surface of the layer of the plating metal within the recess is flush with the unplated remaining portion of the circuit pattern.

24. The method of claim 19, wherein the circuit patterns each include a recess in the planar outer surface at the bond finger, and the layer of the plating metal is within the recess.

* * * * *